United States Patent [19]

Lee et al.

[11] Patent Number: 5,842,690
[45] Date of Patent: *Dec. 1, 1998

[54] SEMICONDUCTOR WAFER ANCHORING DEVICE

[75] Inventors: Che-young Lee, Suwon; Young-kyou Park, Seoul; Seok-jun Lee, Kwangmyong, all of Rep. of Korea

[73] Assignee: Samsung Electronics Co., Ltd., Suwon, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 764,586

[22] Filed: Dec. 13, 1996

[30] Foreign Application Priority Data

Dec. 14, 1995 [KR] Rep. of Korea ............... 1995-49710

[51] Int. Cl.$^6$ ........................... B25B 11/00
[52] U.S. Cl. ............... 269/21; 269/296; 269/25; 269/289 R
[58] Field of Search ............... 269/21, 27, 89, 269/115, 909, 269; 451/338, 365; 204/298, 298.15

[56] References Cited

U.S. PATENT DOCUMENTS

| | | |
|---|---|---|
| 4,075,302 | 2/1978 | Brady et al. ............... 269/909 |
| 4,429,862 | 2/1984 | Niedecker ............... 269/296 |
| 4,473,455 | 9/1984 | Dean et al. ............... 204/298 |
| 4,869,801 | 9/1989 | Helms et al. ............... 204/298 |
| 4,928,936 | 5/1990 | Ohkubo et al. ............... 269/21 |
| 4,952,299 | 8/1990 | Chrisos et al. ............... 204/298.25 |
| 5,152,707 | 10/1992 | Dougherty et al. ............... 451/365 |
| 5,228,501 | 7/1993 | Tepman et al. ............... 29/25.01 |
| 5,262,029 | 11/1993 | Erskine et al. ............... 204/298.15 |
| 5,376,180 | 12/1994 | Mahler ............... 204/298 |
| 5,451,261 | 9/1995 | Fujii et al. ............... 204/298 |
| 5,513,594 | 5/1996 | McClanahan et al. ............... 204/298 |

*Primary Examiner*—James G. Smith
*Assistant Examiner*—Lee Wilson
*Attorney, Agent, or Firm*—Jones & Volentine, L.L.P.

[57] ABSTRACT

A semiconductor wafer anchoring device, which includes a platen having a flat upper surface adapted for mounting a semiconductor wafer thereon, an elastic O-ring located between the platen and the semiconductor wafer, and a clamp disposed to face with the O-ring, which is adapted for pressing upon the upper surface of the semiconductor wafer and for anchoring same. The clamp is a ring-type plate having an inner diameter larger than the diameter of the semiconductor wafer, and having a plurality of protrusions projecting from each quadrant of an inner circumferential surface of the ring-type plate toward the center thereof, an end of each protrusion being adapted to be positioned between a chip pattern and the edge of the semiconductor wafer.

3 Claims, 2 Drawing Sheets

SEMICONDUCTOR WAFER ANCHORING DEVICE

BACKGROUND OF THE INVENTION

The present invention relates to a semiconductor wafer anchoring device for anchoring a wafer, which is loaded by a wafer loading system. More particularly, the invention relates to a semiconductor wafer anchoring device in which the configuration of a clamp is adapted to enhance the product yield from at least one edge of a semiconductor wafer.

A semiconductor wafer anchoring device is used to securely fix a wafer loaded in a sheet unit by a wafer loading system. Such a general semiconductor wafer anchoring device will be described in detail while referring to the attached drawings.

FIGS. 1A and 1B are schematic sectional views of a semiconductor wafer anchoring device, which shows a semiconductor wafer being clamped down. The semiconductor wafer anchoring device is comprised of a platen 20 having a raised flat surface for mounting a semiconductor wafer 10, a suction chuck 30 inserted into a through hole 21 formed in the middle of the platen 20, capable of being moved up and down to provide a means for grasping the semiconductor wafer 10 by suction, an elastic O-ring 40 positioned between the platen 20 and semiconductor wafer 10, and a clamp 50 opposing the O-ring 40, capable of being moved up and down to fix the semiconductor wafer 10.

A suction duct 22 leading to the upper surface of the platen 20 is formed in the platen and may be attached to a means for evacuating the air from the closed space formed by the platen 20, semiconductor wafer 10 and O-ring 40 to provide a vacuum. A gas injecting duct 23 and a gas exhausting duct 24, each communicating with the vacuum space in platen 20, are respectively formed in the platen 20 to provide a means to cool the rear surface of the semiconductor wafer 10.

When the semiconductor wafer 10 is loaded onto the platen 20 by a wafer loading system (not shown), the suction chuck 30 inserted into the through hole 21 is adapted to be moved up and to grasp the wafer 10 by suction (see FIG. 1A). Then, the suction chuck 30 is adapted to be moved down, and thus bring the rear surface of the semiconductor wafer 10 into contact with the O-ring 40 before releasing its suction grip and continuing downward further from the wafer, to provide a means for closing the through hole 21. Thereafter, as shown in FIG. 1B, the clamp 50 is adapted to be moved down, to press against the edges of the semiconductor wafer 10 and to establish a tight contact at a predetermined pressure between the semiconductor wafer 10 and the O-ring 40.

After the above process is completed, a manufacturing process of a semiconductor device starts. Since heat is generated during the manufacturing process, it is necessary to cool the semiconductor wafer 10. Therefore, with the gas ducts 23 and 24 closed, the closed space formed by the semiconductor wafer 10, platen 20 and O-ring 40 is completely evacuated by sucking the air out through the suction duct 22. With the space thus in a vacuum state, the rear (bottom) surface of the semiconductor wafer 10 is cooled by closing the suction duct 22 and injecting cooling gas through the gas injecting duct 23. In such a case, $N_2$ gas is generally used as the cooling gas.

Any chip pattern which is even partially covered by the clamp 50 at the edge of the semiconductor wafer 10 does not undergo a normal device manufacturing process, thus reducing the yield of chip patterns from the wafer.

Conventionally, a ring-type clamp (FIG. 2) and a point-type clamp (FIG. 3) have been used as a means for anchoring the semiconductor wafer device during a manufacturing process step.

Referring to FIG. 2, a ring-type clamp 50a has an inner diameter smaller than the wafer and an outer diameter larger than the wafer. In such a case, the clamp 50a contacts a chip pattern 11 at four edge areas of the semiconductor wafer 10, to result in the production of a defective chip along these edges. Due to that portion of the wafer being covered, a manufacturing process such as ion-implantation normally cannot be performed for those chip patterns having a portion covered.

Meanwhile, as shown in FIG. 3, a point-type clamp 50b has an inner diameter larger than the semiconductor wafer 10 and four protrusions 51 of a predetermined length disposed at 90° intervals around the wafer's perimeter, with one protrusion disposed in each quadrant. The protrusions 51 are adapted to press upon the semiconductor wafer 10 and to fix it against the O-ring 40, but only at the four localized areas. While the clamp 50b does not contact any of the chip patterns 11, this clamping arrangement still has a drawback in that the force applied to the semiconductor wafer 10 is not uniform and the wafer may be loosely fixed such that the closed space formed by the semiconductor wafer 10, platen 20 and O-ring 40 is not sealed very well. Hence, the cooling gas is likely to leak and a complete vacuum state is difficult to maintain. Further, the localized application of force may generate cracks on the edges of the semiconductor wafer.

SUMMARY OF THE INVENTION

An object of the present invention is to provide a semiconductor wafer anchoring device utilizing a clamp having a plurality of irregular protrusions for anchoring at least one edge portion of a semiconductor wafer which is free of chip patterns, and thereby to increase the product yield of a semiconductor wafer while providing a means for tightly fixing the semiconductor wafer during a manufacturing step.

To achieve the above object, there is provided a semiconductor wafer anchoring device comprising: a platen having a flat upper surface, for mounting a semiconductor wafer thereon; an elastic O-ring between the platen and the semiconductor wafer; and a clamp opposing the O-ring, for pressing and anchoring the upper surface of the semiconductor wafer, wherein the clamp is a ring-type plate having an inner diameter larger than the diameter of the semiconductor wafer, and having a plurality of protrusions projecting from each quadrant of the inner circumferential surface toward the center thereof, an end of each protrusion being adapted to be positioned between a chip pattern and the edge of the semiconductor wafer.

According to a preferred embodiment of the present invention, the lengths of the protrusions may be adapted to vary according to the configuration of the chip patterns on the wafer and may be tapered in shape.

The present invention is advantageous in that wafers may be fixed according to chip patterns, i.e., only at edge portions having no chip patterns. Such is adapted to prevent damage to chips and thus to increase their yield while providing a means for tightly fixing the wafers during processing steps.

DETAILED DESCRIPTION OF THE INVENTION

The above object and advantages of the present invention will become more apparent by describing preferred embodiments thereof while referring to the attached drawings.

Figure 1A:
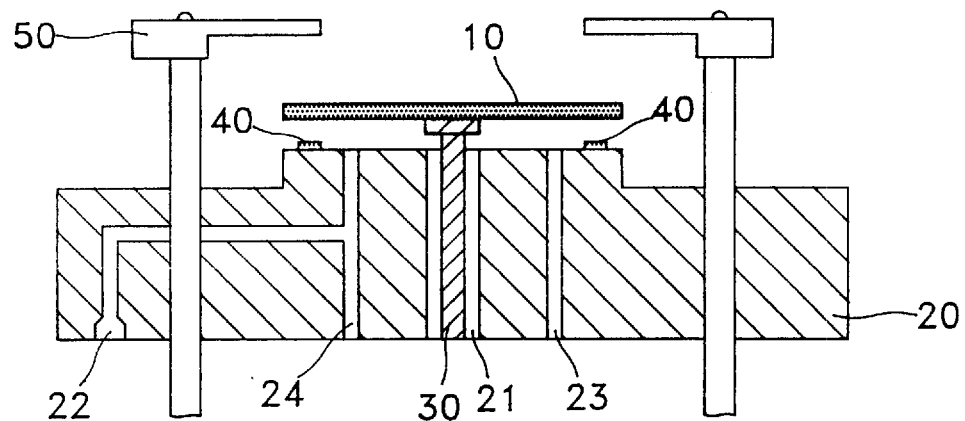
FIGS. 1A and 1B are schematic sectional views of a semiconductor wafer fixing device, showing a semiconductor wafer being clamped down.
Figure 1B:
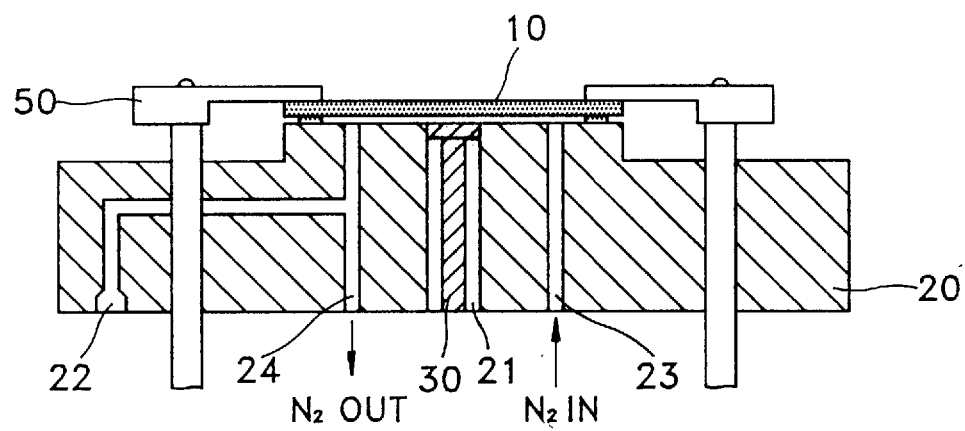
Figure 2:
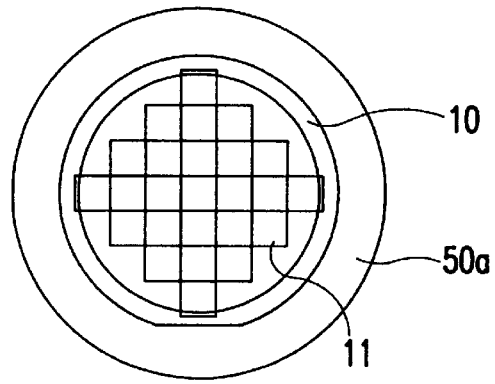
FIG. 2 is a plan view of a conventional ring-type clamp fixing a wafer.
Figure 3:
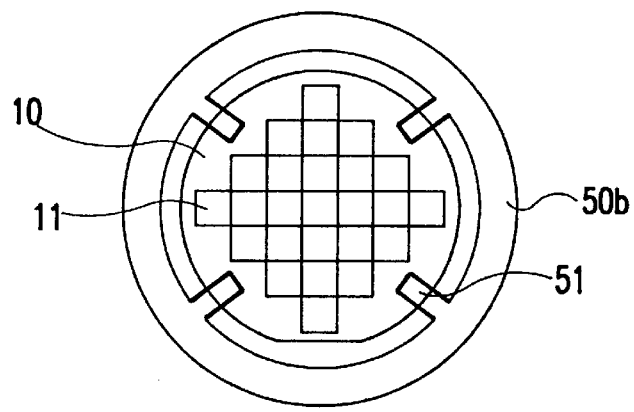
FIG. 3 is a plan view of a conventional point-type clamp fixing a wafer.
Figure 4:
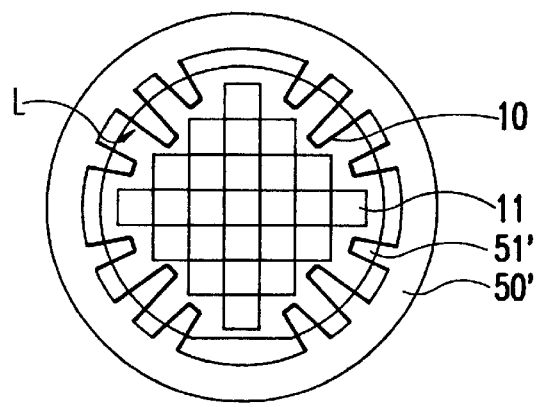
FIG. 4 is a plan view of a semiconductor wafer fixing device of the present invention, shown fixing a wafer.

FIG. 4 is a plan view of a semiconductor wafer fixing device of the present invention, shown fixing a semiconductor wafer 10 on which a plurality of rectangular chip patterns 11 are successively formed. In such a case, it should be noted that a semiconductor wafer usually has edge areas which contain no chip patterns, and that the four corner areas generally form relatively large edge areas which do not have any chip patterns.

Referring to FIG. 4, the semiconductor wafer fixing device according to the present invention uses a clamp 50' made of an annular plate having an inner diameter larger than the diameter of the semiconductor wafer 10 and having a plurality of protrusions 51' projecting inwardly from the inner circumferential surface of the clamp 50', a distal end of each protrusion 51' being adapted to be positioned between a chip pattern and the edge of the semiconductor wafer. The protrusions 51' are radially tapered in shape toward the center of the wafer and may have different radial lengths, L, according to the chip pattern.

To fabricate the clamp 50' of the present invention, a chip pattern of a semiconductor wafer to be used for manufacturing a semiconductor device first may be identified, and then the positions of the clamp protrusions may be varied accordingly with respect to the chip pattern.

As described above, the clamp used in the semiconductor wafer fixing device of the present invention securely fixes a semiconductor wafer in many locations, but is adapted to contact a wafer's edge at portions which have no chip patterns. Accordingly, the semiconductor wafer fixing device of the present invention is adapted to increase process accuracy by tightly fixing the wafer, and to thereby reduce the number of defective products.

While this invention has been described with respect to that which is presently considered to be the most practical and preferred embodiments, the invention is not limited to such disclosed embodiments. It is clearly understood that many variations are possible within the scope and spirit of the present invention by any one skilled in the art. In fact, it is intended that the present invention should cover various modifications and equivalent arrangements within the spirit and scope of the appended claims.

What is claimed is:

1. A semiconductor wafer anchoring device comprising:

a platen having a flat upper surface, which is adapted for mounting a semiconductor wafer thereon;

an elastic O-ring located between said platen and said semiconductor wafer; and a clamp opposing said O-ring, which is adapted for pressing upon an upper surface of said semiconductor wafer and thus anchoring said wafer, said clamp having an annular plate with an inner diameter larger than the diameter of said semiconductor wafer, and having a plurality of protrusions projecting from each quadrant of an inner circumferential surface of the annular plate toward the center of each wafer, said each quadrant corresponding to locations of outermost chip patterns on said semiconductor wafer, each of said plurality of protrusions having a distal end completely positioned between said outermost chip patterns and a peripheral edge of said semiconductor wafer, wherein adjacent ones of said plurality of protrusions in each quadrant are spaced apart with a gap therebetween along said inner circumferential surface.

2. A semiconductor wafer anchoring device as claimed in claim 1, wherein said plurality of protrusions have different radial lengths extending inwardly from the inner circumferential surface toward the center of the wafer.

3. A semiconductor wafer anchoring device as claimed in claim 1, wherein said plurality of protrusions are radially tapered in shape toward the center of the wafer.

* * * * *